(12) United States Patent
Vedam et al.

(10) Patent No.: US 9,703,901 B2
(45) Date of Patent: Jul. 11, 2017

(54) ITERATIVE SYSTEM AND PROCESS WITH NON-LINEAR CORRECTION FACTORS

(71) Applicant: Invensys Systems, Inc., Foxboro, MA (US)

(72) Inventors: Rajkumar Vedam, Houston, TX (US); James Kattapuram, Houston, TX (US); Peter Le, Houston, TX (US)

(73) Assignee: Schneider Electric Software, LLC, Lake Forest, CA (US)

( * ) Notice: Subject to any disclaimer, the term of this patent is extended or adjusted under 35 U.S.C. 154(b) by 919 days.

(21) Appl. No.: 13/968,119

(22) Filed: Aug. 15, 2013

(65) Prior Publication Data

US 2015/0051881 A1    Feb. 19, 2015

(51) Int. Cl.
*G06F 17/50* (2006.01)

(52) U.S. Cl.
CPC ................ *G06F 17/5009* (2013.01)

(58) Field of Classification Search
CPC ....... G06F 17/10; G06F 17/11; G06F 17/5009
See application file for complete search history.

(56) References Cited

U.S. PATENT DOCUMENTS

| | | | | |
|---|---|---|---|---|
| 2003/0005747 A1* | 1/2003 | van der Geest | ......... | G01D 3/08 73/1.16 |
| 2003/0097243 A1* | 5/2003 | Mays | .................. | G05B 13/042 703/2 |
| 2004/0189521 A1* | 9/2004 | Smith | .................. | G01S 13/723 342/387 |
| 2005/0267695 A1* | 12/2005 | German | .................. | G01N 3/30 702/41 |
| 2012/0095603 A1* | 4/2012 | Rashid | .................... | E21B 43/00 700/282 |

OTHER PUBLICATIONS

ROMeo (R) Advanced Settings User Guide 6.0.2, Aug. 24, 2012, Invensys SimSci-Esscor (R), all pages.*

* cited by examiner

*Primary Examiner* — Nathan L Laughlin
(74) *Attorney, Agent, or Firm* — Stephen Manetta; Susmita Bhandari

(57) ABSTRACT

A processor connected to a process module executes processor executable instructions stored on the process module according to process input data received by a process definition interface, according to variables input data received by a variables interface. A non-linear correction factor as defined by a non-linear correction factor module is applied to provide a solution to an iterative process. A processor implemented process solves a process problem and comprises processor executable instructions stored on a tangible storage device.

17 Claims, 2 Drawing Sheets

ITERATIVE SYSTEM AND PROCESS WITH NON-LINEAR CORRECTION FACTORS

BACKGROUND OF THE INVENTION

The present invention generally relates to systems and methods for using tools employing calculations that are designed to capture the economic benefit from processes such as refinery, chemical or petrochemical plant operations.

Systems which include a Rigorous On-line Modeling and Equation-based Optimization (ROMEO) module have used fixed creep and linear creep to improve robustness when there are uncertain initial estimates for evaluating a process.

In particular, the invention relates to iterative modeling systems and methods with equation-based optimization using non-linear correction (e.g., creep) factors.

SUMMARY

In one form, a system solves a process problem. A process module is provided comprising a storage memory device having stored thereon processor executable instructions for defining an iterative process having variables having certain values which, when applied to the iterative process, converge the iterative process to a solution and having other values which, when applied to the iterative process, do not converge the iterative process to a solution. A process definition interface receives process input data defining a particular iterative process corresponding to the process problem and provides the received process input data to the process module. A variables interface receives variables input data defining values for the variables of the iterative process and provides the received variables input data to the process module. A non-linear corrector factor module comprising a storage memory device having stored thereon processor executable instructions defines a non-linear correction factor to be applied to the variables of the iterative process. A processor connected to the process module executes the processor executable instructions stored on the process module according to the process input data received by the process definition interface, according to the variables input data received by the variables interface and applies the non-linear correction factor as defined by the non-linear correction factor module to provide a solution to the particular iterative process.

In another form, the system includes a Rigorous On-line Modeling and Equation-based Optimization (ROMEO) module comprising a storage memory device having stored thereon processor executable instructions for defining an iterative process having certain variables which, when applied to the iterative process, converge the iterative process to a solution and having other variables which, when applied to the iterative process, do not converge the iterative process to a solution. A process definition interface receives process input data defining a particular iterative process and for providing the received process input data to the process module. A variables interface receives variables input data defining values for the variables of the iterative process and provides the received variables input data to the ROMEO module. A non-linear creep factor module comprising a storage memory device having stored thereon processor executable instructions defines a non-linear creep factor to be applied to the variables of the iterative process. A processor connected to the ROMEO module executes the processor executable instructions stored on the ROMEO module according to the process input data received by the process definition interface, according to the variables input data received by the variables interface and applies the non-linear creep factor as defined by the non-linear creep factor module to provide a solution to the particular iterative process.

In another form, a processor implemented process for solving a process problem comprising processor executable instructions stored on a tangible storage device is provided. The instructions comprise instructions for:

defining an iterative process having variables having certain values which, when applied to the iterative process, converge the iterative process to a solution and having other values which, when applied to the iterative process, do not converge the iterative process to a solution;

receiving process input data defining a particular iterative process corresponding to the process problem;

receiving variables input data defining values for the variables of the iterative process;

defining a non-linear correction factor to be applied to the variables of the iterative process; and providing a solution to the particular iterative process according to the process input data, according to the variables input data by applying the defined non-linear correction factor.

In another form, a tangible processor readable media (CRM) device having stored thereon processor executable instructions for solving a process problem is provided. The instructions comprise instructions for:

defining an iterative process having variables having certain values which, when applied to the iterative process, converge the iterative process to a solution and having other values which, when applied to the iterative process, do not converge the iterative process to a solution;

receiving process input data defining a particular iterative process corresponding to the process problem;

receiving variables input data defining values for the variables of the iterative process;

defining a non-linear correction factor to be applied to the variables of the iterative process; and providing a solution to the particular iterative process according to the process input data, according to the variables input data by applying the defined non-linear correction factor.

Other objects and features will be in part apparent and in part pointed out hereinafter.

BRIEF DESCRIPTION OF THE DRAWINGS

Corresponding reference characters indicate corresponding parts throughout the drawings.

DETAILED DESCRIPTION

Figure 1:
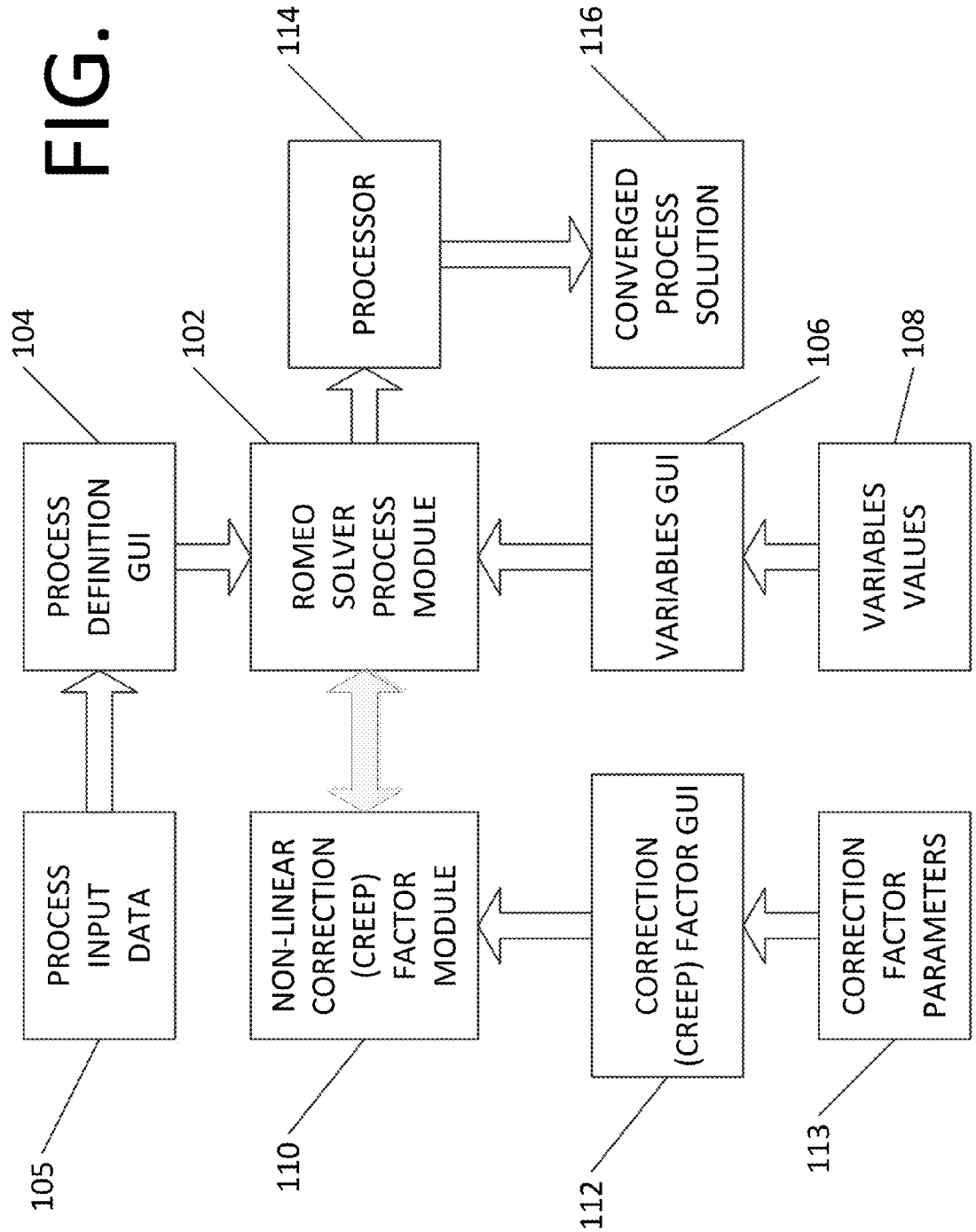
FIG. 1 is a block diagram of one example of a ROMEO solver system.

Systems and methods described herein solve a process problem. A process module comprises a storage memory device having stored thereon processor executable instructions. The instructions define an iterative process having variables having certain values which, when applied to the iterative process, converge the iterative process to a solution and having other values which, when applied to the iterative process, do not converge the iterative process to a solution;

In one form, systems and methods include a rigorous on-line modeling and equation-based optimization system and process (herein "ROMEO solver") employing non-linear correction (i.e., creep) factors to improve robustness in the presence of uncertainty in initial estimates. The ROMEO solver is based on a reduced gradient, infeasible path, active-set, sequential quadratic programming algorithm. The ROMEO solver solves industrial-scale nonlinear optimization problems for real-time optimization, and off-line work. ROMEO solvers can be used in at least three alternative modes of operation to solve a process problem: (1) a "simulation" mode in which it solves a problem defined by a set of nonlinear equations; (2) a "data reconciliation" mode in which it solves a least squares optimization problem; and (3) an "optimization" mode in which it solves a nonlinear optimization problem. Thus, the ROMeo solver involves three stages.

Simulation Mode

As a first step, the existing process is modeled in abstract using the wide variety of predefined ROMeo unit operations. These models range from simple mixers, splitters and flash drums to complete distillation columns and reactors. In addition, ROMeo allows for the inclusion of virtually any type of custom unit operation in the process plant model. In contrast to ordinary process simulation programs that carry out calculations in a unit-by-unit, sequential manner, ROMeo converts the abstract physical model into a single mathematical model that is solved using non-linear matrix arithmetic. This solution method offers considerable time saving, and permits ROMeo to serve as a real time simulation tool.

Data Reconciliation Mode

In the second step, the abstract model is brought into harmony with actual observed operating conditions. This is achieved by reconciling redundant and sometimes inconsistent temperature, pressure, composition and flow rate measurements using established algorithms for evaluating the validity of observed process data. Based on reconciled observed data, process model unit specifications and parameters are modified and adjusted to make the process model conform even more closely to observed reality. ROMeo typically interfaces directly with a plant's distributed control system (DCS) or centralized database and run in an online mode. In this case, no user input is required. However, because it is possible to supply measurement values manually via the graphical user interface, DataRec can also be executed in an offline mode.

Optimization Mode

In the third step, pertinent process variables are assigned monetary values, and controller setpoints are adjusted to maximize the economics of the overall process. Typical examples of monetary assignments would be greater values for preferred stream fractions compared to less desirable fractions, bonuses for additional octane points in a product or a monetary penalty for each ppm of a contaminant or undesirable compound in a stream. The great strength of ROMeo is that it makes it possible for plant engineers to discover in a systematic fashion economic connectivity between unit setpoints, specifications and operating conditions that would otherwise remain undetected and unexploited. These modes of operation involve a basic iterative update, shown in the following equation (1):

$$x_{k+1} = x_k + \lambda_k p_k \quad \text{Equation 1}$$

In equation (1), vector x is the set of variables in the problem, with iteration index, k. The new values of the variables x at iteration k+1 are the addition of the old values of the variables x at iteration k, and an update-vector p at iteration k, multiplied by a scalar line-search parameter called $\lambda$.

ROMEO solvers have a rich set of parameters to customize the behavior to the many classes of problems to which it is applied. Each ROMEO solver has a default set of parameters to help it solve problems "out-of-the-box". One source of poor convergence is poor initial estimates of variables of a specific problem evaluated by a ROMEO solver. The various embodiments herein deal with uncertain initial estimates in ROMEO solvers, particularly estimates based on poor initial estimates of the variables of a specific problem.

FIG. 1 is a block diagram of one example of a ROMEO solver system and method. In one form, a system and method for iteratively solving a process problem is illustrated. A process module 102 of software instructions comprises a storage memory device having stored thereon processor executable instructions for defining an iterative process having variables. The variables have certain values which, when applied to the iterative process, converge the iterative process to a solution. The variables have other values which, when applied to the iterative process, do not converge the iterative process to a solution. In one form the process module 102 comprises a Rigorous On-line Modeling and Equation-based Optimization (ROMEO) module.

A process definition interface 104 such as a GUI (graphical user interface) receives process input data 105 from a source such as a user, from another software program or from a device, which data defines a particular iterative process corresponding to the process problem to be solved. The interface 104 provides the received process input data to the process module 102 for use in executing an interactive model to solve the process problem as noted herein.

A variables interface 106 such as a GUI receives variables input data (e.g., variables values 108) from a source such as a user, from another software program or from a device, which data defines values for the variables of the iterative process. The interface 106 provides the received variables input data to the process module 102 for use in executing an interactive model to solve the process problem as noted herein.

A non-linear corrector factor module 110 comprises a storage memory device having stored thereon processor executable instructions for defining a non-linear correction factor to be applied to the variables of the iterative process for use in executing an interactive model to solve the process problem as noted herein. In one form, a correction factor interface 112 receives correction factor parameters 113 from a source such as a user, from another software program or from a device, which parameters provide the received correction factor parameters to the non-linear correction factor module 110. The non-linear corrector factor module 110 uses the received correction factor parameters to define the non-linear correction factor to be applied to the variables of the iterative process for use in executing an interactive model to solve the process problem as noted herein.

A processor 114 (e.g., a computer) is connected to the process module 102 for executing the processor executable instructions stored on the process module 102 according to the process input data received by the process definition interface 104, according to the variables input data 108 received by the variables interface 106 and applying the non-linear correction factor as defined by the non-linear correction factor module 110 to provide a converged process solution 116 to the particular iterative process. For the adaptive-creep noted here, the process module 102 monitors the non-linear correction factor module 110 to identify solver behavior, so that the arrow therebetween is illustrated as bi-directional.

In one form as noted herein, the non-linear correction factor may be defined by multiple lines. Thus, the correction factor interface 112 can specify a slope for each of the multiple lines. Alternatively or in addition, the non-linear correction factor may be defined by a curved line as noted herein. In one form as noted herein, the non-linear correction factor can be defined by an adaptive algorithm monitoring the solver behavior and inferring the number of iterations based on a quantity of the defined particular iterative process such that the non-linear correction factor is applied adaptively.

As noted above, the processor executable instructions for defining an iterative process stored on the process module 102 can implement three alternative modes of operation to iteratively solve the process problem: (1) a "simulation" mode in which the problem is defined by a set of nonlinear equations; (2) a "data reconciliation" mode in which the problem is defined as a least squares optimization problem; and (3) an "optimization" mode in which the problem is defined as a nonlinear optimization problem.

Uncertainty in initial estimates can be present in any mode of operation, but commonly, in data reconciliation runs. Uncertain initial estimates can cause convergence problems, especially if the estimates are far from the solution, and/or are inconsistent leading to poor directions.

The prior art has proposed that the effects of uncertainty could be minimized by use of solver parameters such as the Hessian parameters and explicit scaling factors. The embodiments herein use a non-linear correction factor called non-linear "creep" as a system and process to improve robustness in the presence of uncertainty in initial estimates. For example, uncertain initial estimates can negatively impact robustness in ROMEO solvers via the following: (a) non-satisfactory default scaling factors; (b) Hessian built with poor direction; (c) non-satisfactory line-search behavior. These have the potential to give incorrect update directions for an SQP (sequential quadratic programming) solver algorithm, leading to unsatisfactory or non-robust behavior.

Large process models created by ROMEO can be expressed in general mathematical form as problem P:

$$P=\max(f(x)) \text{ or } P=\min(f(x)) \quad \text{Equation 2}$$

subject to $$g(x)=0 \quad \text{Equation 3}$$

and $$h(x) \geq 0 \quad \text{Equation 4}$$

where
x≡a vector of real numbers;
f(x)≡a linear/nonlinear objective function;
g(x)=0 represents the model equations with linear and nonlinear equality constraints;
h(x)≥0 represents simple bounds (inequality constraints) on the variables.

Variables in ROMEO are classified into the following three categories:
Fixed/independent—The unit or process specifications (in Simulation, DataRec and Optimization modes) entered through the ROMEO GUI. In the ROMEO documentation, fixed/independent variables are frequently referred to as specification variables.

Free/independent—Controller setpoints (in Optimization mode) or reconciled Measurement values (in DataRec mode). Free/independent variables are frequently referred to as optimization variables and reconciliation variables, respectively.

Free/dependent—The remaining model variables. The values of these variables are determined by the Solver; thus free/dependent variables are frequently referred to as solution variables.

In a Simulation Mode, one goal is to find a feasible solution to a specified process model. Therefore, there is no objective function to minimize and there are no free/independent variables present in the model. The fixed/independent variables represent the process specifications entered through the variables GUI. The free/dependent variables represent the remaining process variables whose values are to be determined by the ROMEO Solver. This reduces the general nonlinear programming (NLP) to solving a system of nonlinear equations, g(x)=0, with a few simple bounds on the variables, h(x)≥0.

Obtaining a solution is not dependent on the existence of these simple bounds. However, bounds on temperatures, pressures, flow rates, and other variables may be needed to constrain the ROMEO Solver to converge to a valid solution describing the process model. For example, an upper bound on a power variable may be added to a motor unit to simulate the power limit of the physical motor that the motor unit models. When a valid solution to the Simulation Mode problem has been found, a Data Reconciliation problem is usually solved to improve the fit of the ROMEO model to the actual process measurements. For this problem, there will be one additional free/independent variable, xreconciled, representing the reconciled model variable and one additional fixed/independent variable, xscanned, representing the scan value for each measurement unit in the flow sheet. This gives one additional degree of freedom to the problem, so an additional term is added to the objective function representing the square of the reconciled model variable's offset from its scanned value. Thus, the objective function in a Data Reconciliation Mode (DataRec mode) takes the form of Equation 5:

$$Obj = \min\left(\sum_{Meas} (x_{reconciled} - x_{scanned})^2\right) \quad \text{Equation 5}$$

where $$\sum_{Meas}$$

is the summation of all measurement unit variables.

In Optimization Mode, the set point variables of the controller units on the flow sheet are automatically changed from fixed/independent specification variables (in Simulation and DataRec modes) to free/independent optimization variables. This creates one additional degree of freedom for the problem. The general form of the objective function for this problem is given in the following Equation 6:

$$Obj = \max\left(\sum_{Sinks} SinkEcon - \sum_{Sources} SourceEcon + \sum_{UserAdded} Wt * UserAdded\right) \quad \text{Eq. 6}$$

where each Σ is the summation of the respective Sink, Source and user-added contributions to the objective function, and Wt is a weight factor assigned by the user for each user-added contribution. This objective function can be converted into a minimization problem simply by multiplying it by −1.

If the user has specified some vapor-liquid equilibrium phases in unit operation product streams as May be Present, an additional set of constraints is added to the general problem as expressed in Equation 2 to Equation 4. These constraints are represented as:

$$h(x)^T \mu = 0 \quad \text{Equation 7}$$

subject to $$h(x) \geq 0 \quad \text{Equation 8}$$

and $$\mu \geq 0 \quad \text{Equation 9}$$

where μ represents the molar amount of a stream that is in each phase that has been specified as May be Present.

By the nature of Equation 7, either h(x) must be at its lower bound of zero or p must be at its lower bound of zero at any point in time. This means that h(x) and p have complementarity and are thus called complementarity constraints.

These complementarity constraints introduce additional complexity to the problem in the form of potential discontinuities caused by the movement of variables across phase boundaries, so it is important that the user specify the correct vapor-liquid phases when they are known.

To simplify the explanation of the ROMEO Solver, these complementarity equations (Equation 7 to Equation 9) will not be included in the derivation below. It will be assumed that the problem is in the form expressed in Equation 2 to Equation 4.

To solve the problems described above, the optimality conditions of the general NLP formulation, as expressed in Equation 2 to Equation 4 and Equation 7 to Equation 9, can be derived. In order to define the optimality conditions for the NLP, a Lagrange function is defined as in the following Equation 10.

$$L(x, \lambda, v) = f(x) - g(x)^T \lambda - h(x)^T v \quad \text{Equation 10}$$

Where λ≡the Lagrange multiplier and
Where v≡the Kuhn-Tucker multiplier

Thus, the Kuhn-Tucker optimality conditions for the NLP occur when this Lagrange function is minimized and the inequality and complementarity constraints are satisfied as shown in Equation 11 to Equation 13:

$$\nabla_x L = \nabla f(x) - \nabla g(x)^T \lambda - \nabla h(x)^T v = 0 \quad \text{Equation 11}$$

$$\nabla_x L = -g(x) = 0 \quad \text{Equation 12}$$

$$h(x) \geq 0 \quad \text{Equation 13}$$

The nonlinear optimality conditions given above can be solved by a Newton method. This is done by linearizing the Taylor series expansions of Equation 11 to Equation 13 about a current point, $X_k$, as shown in)

$$\nabla_x L(x, \lambda) = \nabla f(x_k) - \nabla g(x_k)^T \lambda + H_k(x - x_k) = 0 \quad \text{Equation 14}$$

$$\nabla_x L(x, \lambda) = -g(x_k) - \nabla g(x_k)^T (x - x_k) = 0 \quad \text{Equation 15}$$

$$h(x) = -h(x_k) + \nabla h(x_k)^T (x - x_k) = 0 \quad \text{Equation 16}$$

where $$H_k = \nabla_{xx} L(x_k, \lambda_k) \quad \text{Equation 17}$$

These equations define the solution to a Quadratic Programming problem, QP. Thus, the solution to the original Kuhn-Tucker conditions of Equation 11 to Equation 13 can be found by solving a sequence of Quadratic Programming problems as expressed by Equation 14 to Equation 16 by updating $x_k$ and reevaluating $\nabla f(x_k)$, $g(x_k)$, $\nabla g(x_k)$, $h(x_k)$, and $\nabla h(x_k)$, for each new iteration k.

The Hessian of the Lagrangian, $\nabla_{xx} L(x_k, \lambda_k)$, does not require exact evaluation; it can be updated by using first-order information so that $B_k \approx \nabla_{xx} L(x_k, \lambda_k)$ and $d_k^T B_k d_k$ for all $d_k \neq 0$.

From Equation 14 to Equation 16, the quadratic programming subproblem can be represented as $$P_{sub} = \min(\nabla g(x_k)^T + \frac{1}{2} d_i^T B_k d_k) \quad \text{Equation 18}$$

$$g(x_k) + \nabla g(x_k)^T d_k = 0 \quad \text{Equation 19}$$

$$h(x_k) + \nabla h(x_k)^T d_k \geq 0 \quad \text{Equation 20}$$

where
$d_k$ is a vector of real numbers, and
$d_k = x - x_k$

This QP is solved by using a dual active-set method. First, the unconstrained minimum is found by solving the system of equations resulting from Equation 18 and Equation 19. Then, the violated bound constraints from Equation 20 are added to the active set until all the bound constraints are satisfied.

Due to the bound constraint linearizations in Equation 20, it is possible for the QP subproblem to be infeasible, i.e. there is no $d_k$ which can satisfy $$h(x_k) + h(x_k)^T d_k \geq 0.$$

In this case, the bound constraints from Equation 20 are relaxed and the QP attempts to minimize their violation.

With the search direction, $d_k$, generated from the QP subproblem, the next iteration point, $x_k+1$ is calculated as in $$x_{k+1} = x_k + \alpha_k d_k \quad \text{Equation 21}$$

In order to ensure that Newton's method converges, the full step with $\alpha_k = 1$, cannot always be taken. A suitable value of $0 < \alpha_k < 1$ is determined by minimizing a merit function which balances the improvement in the objective function and the closing of the constraints. This allows the SQP method to converge to a point with an optimum objective value and constraint feasibility, $g(x) = 0$ and $h(x) \geq 0$, simultaneously.

The following is one example of the steps of a general Sequential Quadratic Programming (SQP) algorithm:

1. Given an initial $x_0$, set k=0, and $B_0$=InitialHessianDiag, I.
2. Evaluate $f(x_0)$, $g(x_0)$, and $h(x_0)$.
3. Scale the objective function, equality constraints, and inequality constraints.
4. Evaluate the objective gradient, $\nabla(x_k)$, equality constraint gradients, $\nabla g(x_k)$, and inequality constraint gradients, $\nabla h(x_k)$.
5. Update the approximation to the Hessian, $B_k$.
6. Solve the QP subproblem (defined in Equation 18 to Equation 20) for $d_k$.
7. Back-calculate the multipliers, $\lambda_k$ and $v_k$.
8. Perform line search to determine αk updating $x_k+1=x_k+ \alpha_k d_k$, and $f(x_k+1)$, $g(x_k+1)$, $h(x_k+1)$. This involves creep implementation.
9. Set k=k+1.
10. If NOT converged, go to step 4.
11. Un-scale the objective function, equality constraints, and inequality constraints.

Figure 2:
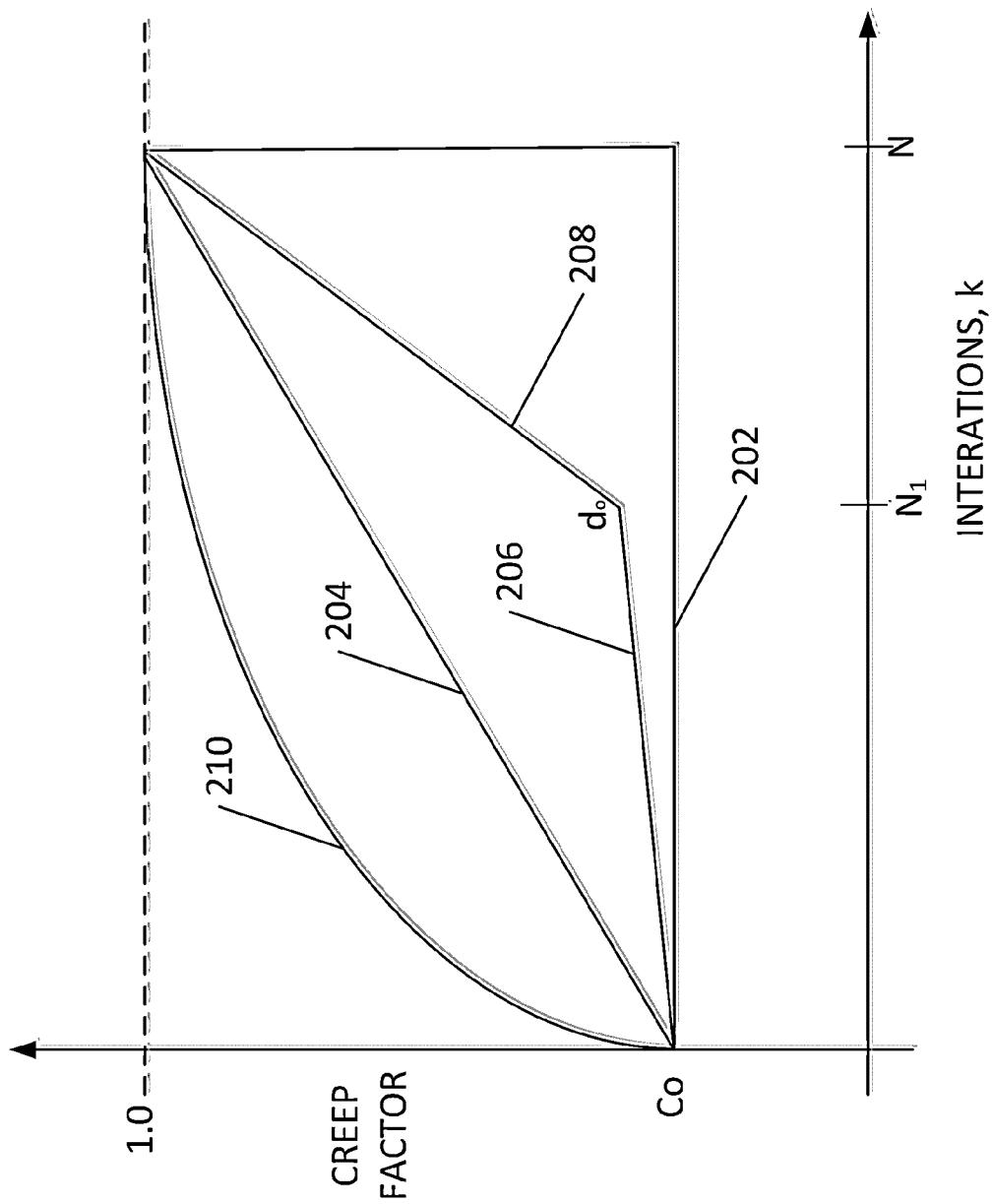
FIG. 2 is a graph with creep factor along the y-axis and iterations along the x-axis illustrating fixed creep, creep on a line, creep on multiple lines, and creep on a curve.

In earlier versions, linear creep factors such as fixed creep or creep on a line were applied to a problem analysis to facilitate convergence. Creep relies on a problem analysis algorithm being able to bootstrap itself from a bad initial estimate, by virtue of being drawn into a region of attraction about the solution within a few iterations. FIG. 2 is a graph with creep factor along the y-axis and iterations along the x-axis illustrating linear creep factors (e.g., fixed creep 202 (prior art) and creep on a sloped line 204 (prior art)), and non-linear creep factors according to aspects of the invention, including creep on multiple lines 206-208, and creep on a curve 210.

When there is uncertainty in the initial estimates, it is likely that the Newton step direction may be incorrect. The Newton step is the vector p in equation 1. Further, a line-search algorithm may experience difficulty to find a good descent direction, and resort to cutbacks, i.e., the scalar value $\lambda_k$ may have to be reduced to a small value. In such cases, it is preferable to discount the Newton step, given that it is largely the result of an uncertain initial estimate. Discounting the Newton step forces the algorithm to "slow down", rippling its effects on the construction of the Hessian as well. Upon re-evaluation of the Jacobian and Hessian at a nearby point, it is possible to get a better search direction. Sometimes the discounting of the Newton step needs to happen over a few iterations, giving the algorithm a chance to move some distance from a bad initial point. This discounting is termed "creep".

Creep is implemented using a scalar factor "c" that is strictly greater than zero, and less than or equal to one. This factor multiplies the vector "p" shown in equation 1. When less than 1, the scalar factor "c" has the effect of reducing the magnitude of the vector "p", while preserving the relative direction of convergence. Implementing this scalar factor "c" (which can change over iterations), equation 1 is modified as follows:

$$x_{k+1} = x_k + \lambda_k [c_k p_k]$$   Equation 22

In equation (22), the brackets "[ . . . ]" indicate that the creep operation is executed by the processor prior to the line-search operation. The line-search thus implicitly considers the effect of the creep.

Fixed Creep (Prior Art)

In fixed creep, a constant creep factor 202 of a specified magnitude Co is applied, for a specified number of iterations, shown in equation 23.

$$c_k = c_0, \ k=1,2,\ldots,N$$   Equation 23

In equation 23, Co is the specified creep, and N is the number of iterations over which it has to be applied, commencing with the first iteration. It is seen that this behaves as a step-function, shown in FIG. 2. While this mode of creep is useful in improving robustness, it also has disadvantages. For example, for expensive iterations, the fixed-creep may be overly conservative, leading to slow convergence. This is because an uncertain system may require a very small creep to start with, but in subsequent steps, it can tolerate larger (but not unity) creep. The fixed-creep does not offer scope to take advantage of this. Also, the sudden removal of creep at k=N constitutes a "shock" step-loading, and is a discontinuity. In numerically stressed systems, such a step-loading can constitute a new form of poor robustness.

Linear Creep (Prior Art)

As remarked in the previous section, fixed creep 202 can be overly conservative, and also the step-change at N may not be desirable. Alternatively, a linear creep factor 204 may be computed that changes with iteration count. This mechanism is based on creeping on a line of internally-determined slope for a given number of iterations. The user specifies the initial creep factor Co, and the number of iterations, N, over which to apply the line-creep. Then the internal-slope is computed using the following formula:

$$m = \frac{(1 - c_0)}{N}$$   Equation 24

Having computed the slope "m" internally, at each iteration k, the linear creep factor is computed as indicted in equation 25:

$$c_k = mk + c_0, \ k=1,2,\ldots,N \text{ such that } c_N = 1$$   Equation 25

Note that linear creep 204 avoids the above-noted drawbacks seen with fixed creep 202. Line creep 204 is not conservative—a small creep factor initially can be larger in subsequent steps. Also, there is no step-loading as seen in fixed-creep 202 because line-creep 204 smoothly goes to 1.0 at the end of the application at N iterations.

A potential disadvantage that provides impetus for more refinement is that, in line-creep 204, there is only a single fixed slope over which creep is applied. In some poorly initialized systems, such a fixed slope can be overly optimistic.

Non-Linear Creep

Creep on Multiple Lines

This section illustrates non-linear creeping on two lines 206-208, though it can be applied to more than two lines, also.

In this embodiment, the user via the correction factor GUI 112 specifies the following:

(i) Initial creep factor, Co;
(ii) An intermediate iteration count at which to terminate an initial line, $N_1$;
(iii) Intermediate creep factor at the intermediate point, $d_0$;
(iv) Total number of creep iterations, N.

Then, the formulas to compute the slopes of the two lines are:

$$m_1 = \frac{(d_0 - c_0)}{N_1} \text{ and } m_2 = \frac{(1 - d_0)}{N - N_1}$$   Equation 26

Having computed the two slopes, the creep-factors for the two lines are computed dynamically at each iteration k, as shown below:

$$c_k = m_1 k + c_0, \ k=1,2,\ldots N_1$$

$$c_{k+N_1} = m_2 k + d_0, \ k=N_1+1,\ldots,N, \text{ such that } c_N = 1$$   Eq. 27

This allows the user to specify, for example, a conservative line for a specified number of iterations, then a more optimistic line.

Creep on a Curve

Another embodiment comprises creep on a curve 210. This allows the advantage of variable creep as well as smooth transition to the final value. Such a non-linear creep on a curve 210 would in general require specification of (i) An initial creep; (ii) Number of iterations N; (iii) a curve-type. With this, the creep-factor on a curve 210 as illustrated for example in FIG. 2, shown abstractly, is computed by equation 28:

$$c_k = f(c_{k-1}), \ k=1,2,\ldots,N, \text{ such that } c_1 = c_0 \text{ and } c_N = 1$$   Eq. 28

As a concrete example, consider a sinusoidal curve. The curve-creep is computed thus:

$$c_k = \sin\left(\left(\frac{k}{N}\right)\left(\frac{\pi}{2}\right)\right), \text{ for } k = 1, 2, \ldots, N \quad \text{Equation 29}$$

Here, note that the initial creep-factor is superfluous in at least some scenarios. In this case, the curve-creep 210 allows taking creep-steps that are initially more optimistic than a line-creep 204, but slowing down on nearing the target. Another example is the exponential curve, which takes very small steps initially, then large steps:

$$c_k = c_Q^{N-k}, \text{ for } k=1,2,\ldots,N \quad \text{Equation 30}$$

Adaptive Creep

In another embodiment, adaptive non-linear creep factors may be employed. In the corrections proposed above, the user a priori specifies the number of iterations to apply the creep. This may not satisfactory because the end user may have no idea on specifying this data. It is thus desirable to specify just the initial creep and adaptively define the end-point, based on some measurement of some definition of robustness. In fact, the user can only specify an initial creep factor. The description in the steps that follow is a description of the adaptive algorithm where the final target is moved adaptively till satisfactory behavior is achieved. For example, an exemplary algorithm can proceed as follows:

1. Use a small "probing" iteration count, such as 3.
2. Choose a terminal creep factor such as 3*Co, or 1.0, whichever is smaller.
3. Compute a line-creep using the first formula in equation 27.
4. During the "probe" iterations, measure some robustness measure (defined below).
5. If the robustness measure looks good, and the final creep factor 1.0 has not been accomplished, go to step (4). If the final creep-factor of 1.0 is achieved, exit. If the robustness measure does not look good, go to step (6).
6. Compute the second line in equation (27), using 3 more iterations, with 1.0 as the final creep-factor, and go to step (4).
7. If the robustness measure does not look good, use 3 more "probe" iterations, with a terminating creep factor such as d0+d0/2 or 1.0, whichever is smaller, where d0 is the final creep-value at the end of the previous stage of "probe" iterations, and go to step (4).

The robustness measure can be computed in several ways: (i) constraint-closure norm; (ii) cost-function moving in the right direction; (iii) smallest number of cutbacks of line-step; or (iv) a weighted sum of some or all these measures.

It is instructive to look at the creep factors resulting from these various calculations. Table 1 summarizes the results for the fixed creep 202, single line creep 204, two-line creep 206-208, sine creep 210, and exponential creep 210. The following data is used:
Initial creep=0.15
Number of iterations=7
Intermediate creep factor=0.2
Intermediate iteration point=3.

| Iteration→ | 1 | 2 | 3 | 4 | 5 | 6 | 7 |
|---|---|---|---|---|---|---|---|
| Fixed 202 | 0.15 | 0.15 | 0.15 | 0.15 | 0.15 | 0.15 | 1.0 |
| Line 204 | 0.27 | 0.39 | 0.51 | 0.64 | 0.76 | 0.88 | 1.0 |
| Two-Line 206-208 | 0.167 | 0.183 | 0.2 | 0.4 | 0.6 | 0.8 | 1.0 |
| Sine 210 | 0.223 | 0.434 | 0.624 | 0.782 | 0.901 | 0.975 | 1.0 |
| Exponential 210 | 1.1e−5 | 7.6e−5 | 5.1e−4 | 3.4e−3 | 2.3e−2 | 1.5e−1 | 1.0 |

It is also contemplated that the adaptive creep factor may be defined by several other mathematical artifacts in addition to or in place of the exemplary algorithm noted above in steps 1-7. It is possible to not specify some data in lieu of others to compute the creep-factors. For example, it may not be needed to specify the number of iterations. An algorithm can infer the number of iterations based on some other parameters of the process such as a dynamically measured "robustness" measure. This has the added advantage that the creep is applied adaptively. As a second example, a user can specify slopes for multiple line creep 206-208 from which the number of iterations can be specified.

"Creep" has been referred to herein as a correction factor and can also be labeled a "CertaintyFactor." Calling it a "CertaintyFactor" encourages users to think about how certain they are in the quality of the initial estimates, and specify a number appropriately ("10% certain", "25% certain", etc.)

The Abstract and summary are provided to help the reader quickly ascertain the nature of the technical disclosure. They are submitted with the understanding that they will not be used to interpret or limit the scope or meaning of the claims. The summary is provided to introduce a selection of concepts in simplified form that are further described in the Detailed Description. The summary is not intended to identify key features or essential features of the claimed subject matter, nor is it intended to be used as an aid in determining the claimed subject matter.

For purposes of illustration, programs and other executable program components, such as the operating system, are illustrated herein as discrete blocks. It is recognized, however, that such programs and components reside at various times in different storage components of a computing device, and are executed by a data processor(s) of the device.

Although described in connection with an exemplary computing system environment, embodiments of the aspects of the invention are operational with numerous other general purpose or special purpose computing system environments or configurations. The computing system environment is not intended to suggest any limitation as to the scope of use or functionality of any aspect of the invention. Moreover, the computing system environment should not be interpreted as having any dependency or requirement relating to any one or combination of components illustrated in the exemplary operating environment. Examples of well-known computing systems, environments, and/or configurations that may be suitable for use with aspects of the invention include, but are not limited to, personal computers, server computers, handheld or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments of the aspects of the invention may be described in the general context of data and/or processor-executable instructions, such as program modules, stored one or more tangible, non-transitory storage media and executed by one or more processors or other devices. Generally, program modules include, but are not limited to, routines, programs, objects, components, and data structures that perform particular tasks or implement particular abstract data types. Aspects of the invention may also be practiced in distributed computing environments where tasks are performed by remote processing devices that are linked through a communications network. In a distributed computing environment, program modules may be located in both local and remote storage media including memory storage devices.

In operation, processors, computers and/or servers may execute the processor-executable instructions (e.g., software, firmware, and/or hardware) such as those illustrated herein to implement aspects of the invention.

Embodiments of the aspects of the invention may be implemented with processor-executable instructions. The processor-executable instructions may be organized into one or more processor-executable components or modules on a tangible processor readable storage medium. Aspects of the invention may be implemented with any number and organization of such components or modules. For example, aspects of the invention are not limited to the specific processor-executable instructions or the specific components or modules illustrated in the figures and described herein. Other embodiments of the aspects of the invention may include different processor-executable instructions or components having more or less functionality than illustrated and described herein.

The order of execution or performance of the operations in embodiments of the aspects of the invention illustrated and described herein is not essential, unless otherwise specified. That is, the operations may be performed in any order, unless otherwise specified, and embodiments of the aspects of the invention may include additional or fewer operations than those disclosed herein. For example, it is contemplated that executing or performing a particular operation before, contemporaneously with, or after another operation is within the scope of aspects of the invention.

When introducing elements of aspects of the invention or the embodiments thereof, the articles "a," "an," "the," and "said" are intended to mean that there are one or more of the elements. The terms "comprising," "including," and "having" are intended to be inclusive and mean that there may be additional elements other than the listed elements.

In view of the above, it will be seen that several advantages of the aspects of the invention are achieved and other advantageous results attained.

Not all of the depicted components illustrated or described may be required. In addition, some implementations and embodiments may include additional components. Variations in the arrangement and type of the components may be made without departing from the spirit or scope of the claims as set forth herein. Additional, different or fewer components may be provided and components may be combined. Alternatively or in addition, a component may be implemented by several components.

The above description illustrates the aspects of the invention by way of example and not by way of limitation. This description enables one skilled in the art to make and use the aspects of the invention, and describes several embodiments, adaptations, variations, alternatives and uses of the aspects of the invention, including what is presently believed to be the best mode of carrying out the aspects of the invention. Additionally, it is to be understood that the aspects of the invention is not limited in its application to the details of construction and the arrangement of components set forth in the following description or illustrated in the drawings. The aspects of the invention are capable of other embodiments and of being practiced or carried out in various ways. Also, it will be understood that the phraseology and terminology used herein is for the purpose of description and should not be regarded as limiting.

Having described aspects of the invention in detail, it will be apparent that modifications and variations are possible without departing from the scope of aspects of the invention as defined in the appended claims. It is contemplated that various changes could be made in the above constructions, products, and process without departing from the scope of aspects of the invention. In the preceding specification, various preferred embodiments have been described with reference to the accompanying drawings. It will, however, be evident that various modifications and changes may be made thereto, and additional embodiments may be implemented, without departing from the broader scope of the aspects of the invention as set forth in the claims that follow. The specification and drawings are accordingly to be regarded in an illustrative rather than restrictive sense.

What is claimed is:

1. A system for solving a process problem comprising:
   a process module comprising a storage memory device having stored thereon processor executable instructions for defining an iterative process having variables having certain values which, when applied to the iterative process, converge the iterative process to a solution and having other values which, when applied to the iterative process, do not converge the iterative process to a solution;
   a process definition interface for receiving process input data defining a particular iterative process corresponding to the process problem and for providing the received process input data to the process module;
   a variables interface for receiving variables input data defining values for the variables of the iterative process and for providing the received variables input data to the process module;
   a non-linear corrector factor module comprising a storage memory device having stored thereon processor executable instructions for defining a non-linear correction factor to be applied to the variables of the iterative process;
   a processor connected to the process module for executing the processor executable instructions stored on the process module according to the process input data received by the process definition interface, according to the variables input data received by the variables interface and applying the non-linear correction factor as defined by the non-linear correction factor module to provide a solution to the particular iterative process; and
   a correction factor interface configured to present a user with an option to select at least two non-linear corrector factors wherein the non-linear correction factors include:
   a non-linear correction factor defined by multiple lines having different slopes; and
   a non-linear correction factor defined by a curved line provided by the user.

2. The system of claim 1 wherein the correction factor interface receives correction factor slope parameters from the user and provides the received correction factor slope parameters to the non-linear correction factor module and wherein the non-linear corrector factor module uses the received correction factor slope parameters to specify a different slope for each of the multiple lines.

3. The system of claim 1 wherein the processor executable instructions for defining an iterative process stored on the process module implement three alternative modes of operation to solve the process problem: (1) a "simulation" mode in which the problem is defined by a set of nonlinear equations; (2) a "data reconciliation" mode in which the problem is defined as a least squares optimization problem; and (3) an "optimization" mode in which the problem is defined as a nonlinear optimization problem.

4. The system of claim 1 wherein the correction factor interface receives correction factor curve parameters from the user and provides the received correction factor curve parameters to the non-linear correction factor module and wherein the non-linear corrector factor module uses the received correction factor curve parameters to specify the curved line.

5. The system of claim 4 wherein the correction factor curve parameters define a sinusoidal curve.

6. A system for solving a process problem comprising:
a Rigorous On-line Modeling and Equation-based Optimization (ROMEO) module comprising a storage memory device having stored thereon processor executable instructions for defining an iterative process having certain variables which, when applied to the iterative process, converge the iterative process to a solution and having other variables which, when applied to the iterative process, do not converge the iterative process to a solution;
a process definition interface for receiving process input data defining a particular iterative process and for providing the received process input data to the process module;
a variables interface for receiving variables input data defining values for the variables of the iterative process and for providing the received variables input data to the ROMEO module;
a non-linear creep factor module comprising a storage memory device having stored thereon processor executable instructions for defining a non-linear creep factor to be applied to the variables of the iterative process; and
a processor connected to the ROMEO module for executing the processor executable instructions stored on the ROMEO module according to the process input data received by the process definition interface, according to the variables input data received by the variables interface and applying the non-linear creep factor as defined by the non-linear creep factor module to provide a solution to the particular iterative process,
wherein the non-linear creep factor is defined by an algorithm specified by a user via the variables interface, the algorithm inferring the number of iterations based on a quantity of the defined particular iterative process specified by the user such that the non-linear creep factor is applied adaptively and wherein the number of iterations is defined by a parameter of the process defined by the user.

7. The system of claim 6 wherein the processor executable instructions for defining an iterative process stored on the ROMEO module implement three alternative modes of operation to solve the process problem: (1) a "simulation" mode in which the problem is defined by a set of nonlinear equations; (2) a "data reconciliation" mode in which the problem is defined as a least squares optimization problem; and (3) an "optimization" mode in which the problem is defined as a nonlinear optimization problem.

8. The system of claim 6 wherein the iterations are repeated until a robustness measure meets a preset minimum.

9. The system of claim 8 wherein the robustness measure is computed in one or more of the following ways: (i) constraint-closure norm; (ii) cost-function moving in the right direction; (iii) smallest number of cut-backs of line-step; or (iv) a weighted sum of some or all these measures.

10. A system for solving a process problem comprising:
a process module comprising a storage memory device having stored thereon processor executable instructions for defining an iterative process having variables having certain values which, when applied to the iterative process, converge the iterative process to a solution and having other values which, when applied to the iterative process, do not converge the iterative process to a solution;
a process definition interface for receiving process input data defining a particular iterative process corresponding to the process problem and for providing the received process input data to the process module;
a variables interface for receiving variables input data defining values for the variables of the iterative process and for providing the received variables input data to the process module;
a non-linear corrector factor module comprising a storage memory device having stored thereon processor executable instructions for defining a non-linear correction factor to be applied to the variables of the iterative process;
a processor connected to the process module for executing the processor executable instructions stored on the process module according to the process input data received by the process definition interface, according to the variables input data received by the variables interface and applying the non-linear correction factor as defined by the non-linear correction factor module to provide a solution to the particular iterative process; and
a correction factor interface configured to present a user with an option to select at least three non-linear corrector factors wherein the non-linear correction factors include:
a non-linear correction factor defined by multiple lines having different slopes;
a non-linear correction factor defined by a curved line provided by the user; and
a non-linear adaptive correction factor defined by an algorithm inferring the number of iterations based on a quantity of the defined particular iterative process such that the non-linear correction factor is applied adaptively.

11. The system of claim 10 wherein the number of non-linear adaptive correction factor iterations is defined by a parameter of the process.

12. The system of claim 10 wherein the correction factor interface receives correction factor slope parameters from the user and provides the received correction factor slope parameters to the non-linear correction factor module and wherein the non-linear corrector factor module uses the received correction factor slope parameters to specify a different slope for each of the multiple lines.

13. The system of claim 10 wherein the correction factor interface receives correction factor curve parameters from the user and provides the received correction factor curve parameters to the non-linear correction factor module and wherein the non-linear corrector factor module uses the received correction factor curve parameters to specify the curved line.

14. The system of claim 13 wherein the correction factor curve parameters define a sinusoidal curve.

15. The system of claim 10 wherein the non-linear adaptive correction factor iterations are repeated until a robustness measure meets a preset minimum.

16. The system of claim 15 wherein the robustness measure is computed in one or more of the following ways: (i) constraint-closure norm; (ii) cost-function moving in the right direction; (iii) smallest number of cut-backs of line-step; or (iv) a weighted sum of some or all these measures.

17. The system of claim 10 wherein the processor executable instructions for defining an iterative process stored on the process module implement three alternative modes of operation to solve the process problem: (1) a "simulation" mode in which the problem is defined by a set of nonlinear equations; (2) a "data reconciliation" mode in which the problem is defined as a least squares optimization problem; and (3) an "optimization" mode in which the problem is defined as a nonlinear optimization problem.

\* \* \* \* \*